United States Patent
Hu et al.

(10) Patent No.: US 10,782,718 B2
(45) Date of Patent: Sep. 22, 2020

(54) SYSTEM AND METHOD FOR AUTOMATICALLY TESTING VOLTAGE REGULATORS

(71) Applicant: Hangzhou MPS Semiconductor Technology Ltd., Hangzhou (CN)

(72) Inventors: Wangmiao Hu, Hangzhou (CN); Lijie Jiang, Hangzhou (CN); Qian Ouyang, Hangzhou (CN); Qingqing Zheng, Hangzhou (CN); Binci Xu, Hangzhou (CN); Jinghai Zhou, Saratoga, CA (US); Eric Yang, San Jose, CA (US)

(73) Assignee: Hangzhou MPS Semiconductor Technology Ltd., Hangzhou (CN)

( * ) Notice: Subject to any disclaimer, the term of this patent is extended or adjusted under 35 U.S.C. 154(b) by 269 days.

(21) Appl. No.: 16/001,891

(22) Filed: Jun. 6, 2018

(65) Prior Publication Data

US 2018/0356848 A1 Dec. 13, 2018

(30) Foreign Application Priority Data

Jun. 8, 2017 (CN) .......................... 2017 1 0427306

(51) Int. Cl.

| | |
|---|---|
| *G05F 1/575* | (2006.01) |
| *G01R 31/40* | (2020.01) |
| *G06F 17/50* | (2006.01) |
| *G06F 1/26* | (2006.01) |
| *G05B 19/042* | (2006.01) |
| *H02M 3/157* | (2006.01) |
| *G06F 30/367* | (2020.01) |

(52) U.S. Cl.
CPC ............ *G05F 1/575* (2013.01); *G01R 31/40* (2013.01); *G05B 19/0425* (2013.01); *G06F 1/26* (2013.01); *G06F 30/367* (2020.01); *H02M 3/157* (2013.01); *G05B 19/042* (2013.01)

(58) Field of Classification Search
CPC .. G01R 31/40; G05B 19/042; G05B 19/0425; G05F 1/575; G06F 1/26; G06F 30/367; H02M 3/157
USPC ................... 702/64, 118, 120, 121; 320/135; 324/73.1, 120, 426; 365/154, 201
See application file for complete search history.

(56) References Cited

U.S. PATENT DOCUMENTS

| | | | | |
|---|---|---|---|---|
| 5,537,030 A | * | 7/1996 | Snodgrass | G01R 31/42 324/73.1 |
| 8,705,300 B1 | * | 4/2014 | Xu | G11C 5/147 365/154 |
| 9,541,973 B2 | | 1/2017 | Yang et al. | |
| 9,684,745 B2 | | 6/2017 | Yang et al. | |

\* cited by examiner

*Primary Examiner* — John H Le
(74) *Attorney, Agent, or Firm* — Perkins Coie LLP

(57) ABSTRACT

A method for automatically testing a voltage regulator, including: providing an auto-test setting to a test master, wherein the auto-test setting specifies an auto-sweep setting and a loop comprising an ordered set of serial command frames; producing, in the test master, a test suite comprising a plurality of serial command frames by executing the loop multiple times according to the auto-sweep setting until an array of a preset variable corresponding to the auto-sweep setting is traversed, wherein the preset variable is changed in each iteration of the loop; sequentially transmitting every serial command frame to the voltage regulator; and receiving every resulting behavior of the voltage regulator when operated in accordance with the every serial command frame.

20 Claims, 9 Drawing Sheets

SYSTEM AND METHOD FOR AUTOMATICALLY TESTING VOLTAGE REGULATORS

CROSS-REFERENCE TO RELATED APPLICATIONS

This application claims the benefit of CN application 201710427306.9, filed on Jun. 8, 2017, and incorporated herein by reference.

TECHNICAL FIELD

The present invention relates generally to voltage regulators, and more particularly but not exclusively to system and method for automatically testing voltage regulators.

BACKGROUND

Power management for electronic devices, such as computers, mobile phones, digital music players, and the like, involves the use of a voltage regulator to provide a tightly regulated supply voltage. A popular voltage regulator employed in electronic devices is a DC-DC (direct current-to-direct current) converter. The DC-DC converter is provided by its vendor in integrated circuit (IC) form. A power management application may require the voltage regulator IC to meet one or more requirements, such as switching frequency, output voltage, and so on. The voltage regulator IC is designed and configured to operate in a variety of conditions to meet different customer requirements. To determine the performance of the voltage regulator IC, it's required to test whether or how well the voltage regulator works.

Commonly, the configured voltage regulators are typically used to provide output voltages for CPUs. In particular test, the CPU directly transmits serial VID signals as test commands to the voltage regulators that provide output voltages for the CPU. However, the output voltages from the voltage regulators may be unstable and unsafe, which may damage the CPU. Moreover, in a traditional test method, the output voltage of the voltage regulator is manually checked with a voltmeter during every test case execution, which is unduly laborious and time-consuming and thus low efficiency. In addition, current power management requirements for electronic systems are rather complex, with many different power supply rails for different output voltages. This in turn increases the manual cost and the time required to test the voltage regulators. The prior manual test method typically requires be improved.

SUMMARY

Embodiments of the present invention are directed to a method for automatically testing a voltage regulator, the method comprises: providing an auto-test setting from a computer to a test master, wherein the auto-test setting specifies a first auto-sweep setting and a loop that comprises an ordered set of serial command frames, producing a test suite or test suites in the test master, sequentially transmitting every serial command frame to the voltage regulator, and receiving every resulting behavior of the voltage regulator when operated in accordance with the every serial command frame. Wherein the test suite that comprises a plurality of serial command frames is produced by executing the loop multiple times in accordance with the first auto-sweep setting until an array of a preset variable corresponding to the first auto-sweep setting is traversed, wherein for each iteration of the loop, the preset variable is changed.

BRIEF DESCRIPTION OF THE DRAWING

Non-limiting and non-exhaustive embodiments are described with reference to the following drawings. The drawings are only for illustration purpose. These drawings are not necessarily drawn to scale. The relative sizes of elements illustrated by the drawings may differ from the relative size depicted.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
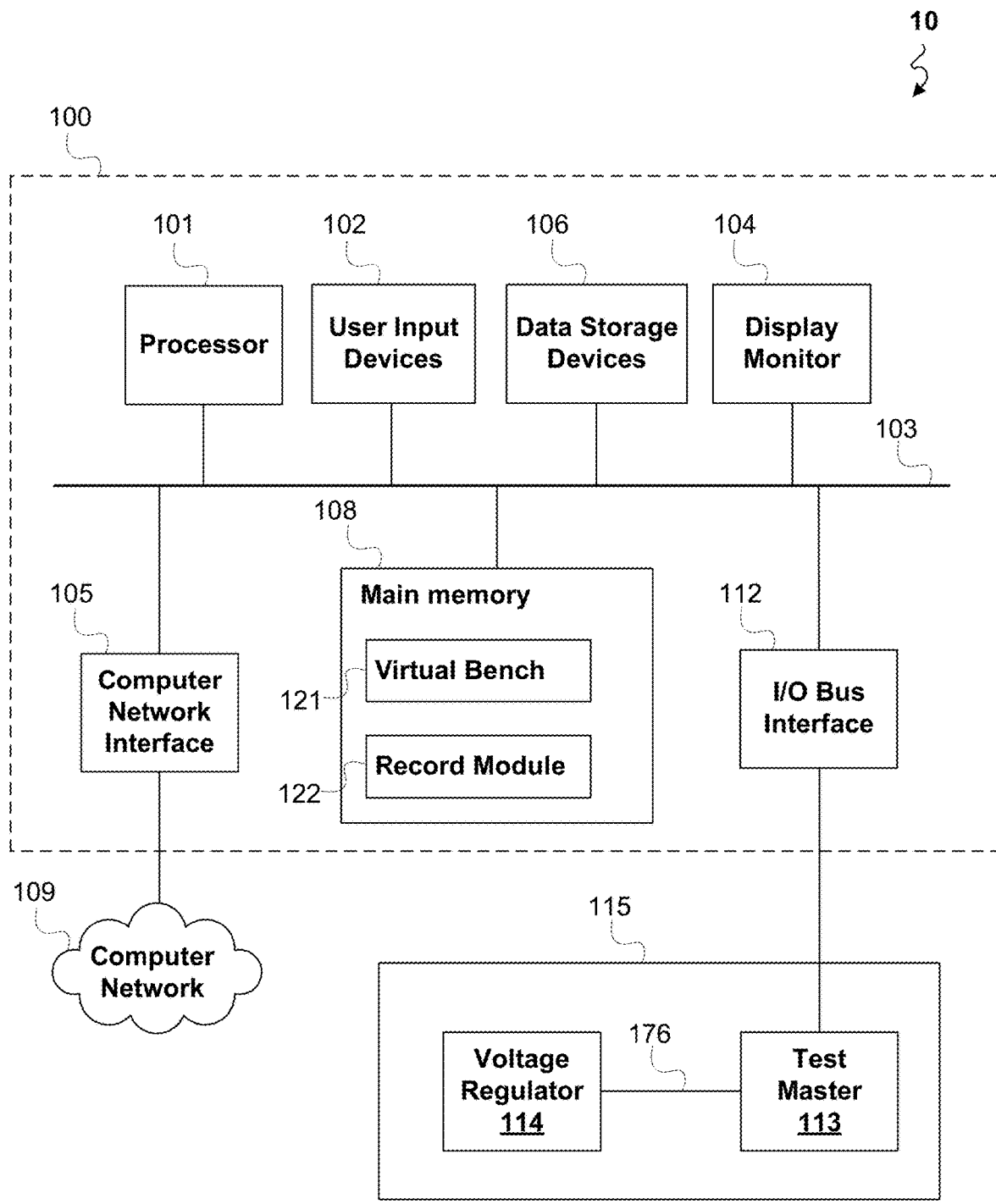
FIG. 1 schematically illustrates a block diagram of a system 10 for automatically testing a voltage regulator in accordance with an embodiment of the present invention.

FIG. 1 schematically illustrates a block diagram of a system 10 for automatically testing a voltage regulator in accordance with an embodiment of the present invention. In the embodiment of FIG. 1, the system 10 comprises a computer 100, a test master 113 and a voltage regulator 114. The computer 100 may be employed by a testing user, who is typically an electrical engineer, to provide an auto-test setting to meet particular user test requirements. The auto-test setting is configured to specify an auto-sweep setting and a loop that comprises an ordered set of serial command frames. The loop functions as a test case for testing a specific functionality.

The computer 100 may have fewer or more components without detracting from the merits of the present invention. In the embodiment of FIG. 1, the computer 100 includes a processor 101 and one or more buses 103 coupling its various components. The computer 100 may include one or more user input devices 102 (e.g., keyboard, mouse), one or more data storage devices 106 (e.g., hard drive, optical disk, Universal Serial Bus memory), a display monitor 104 (e.g., liquid crystal display, flat panel monitor, cathode ray tube), a computer network interface 105 (e.g., network adapter, modem), and a main memory 108 (e.g., random access memory). The computer network interface 105 may be coupled to a computer network 109.

The computer 100 is a particular machine as programmed with software modules, which in the example of FIG. 1 includes a virtual bench 121 and a record module 122. The aforementioned software modules comprise computer-readable program code stored non-transitory in the main memory 108 for execution by the processor 101. The computer 100 may be configured to perform its functions by executing the software modules. The software modules may be loaded from the data storage device 106 to the main memory 108. An article of manufacture may be embodied as computer-readable storage medium including instructions that when executed by a computer causes the computer to be operable to perform the functions of the software modules.

The virtual bench 121 may comprise computer-readable program code that provides a graphical user interface (GUI) functions as a portal and interface to provide the auto-test setting. More specifically, the virtual bench 121 receives user interface events, e.g., mouse clicks, mouse movements, text entry, tec., to provide the auto-test setting that specifies the auto-sweep setting and the loop, to meet one or more user test requirements, such as switching frequency, output voltage, and so on. The test requirements may be entered by the user by selecting ICs being tested, electrical values, output voltage, switching frequency, and other parameters. In one embodiment, the user-provided auto-test setting can be saved by the virtual bench 121 in a configuration file in a particular format that the test master 113 can read. The configuration file can specify the parameter values, variables, auto-sweep settings, the sequence and data of the loop execution. As another example, the virtual bench 121 may enable a provision for invoking an already designed configuration by performing a user interface event.

In the example of FIG. 1, the computer 100 includes an input/output (I/O) bus interface 112. The I/O bus interface 112 may comprise a universal serial bus (USB) interface, for example. The test master 113 may be coupled to the computer 100 by way of the I/O bus interface 112. For example, the test master 113 and the configured voltage regulator 114 may be installed to an auto-test platform 115 that converts USB communications to I2C bus communications supported by the voltage regulator 114. The common high performance serial communication bus supported by the voltage regulator 114 comprises one of Intel's Serial Voltage Identification (SVID) bus, AMD's Serial Voltage Interface (SVI) bus, PMBUS Adaptive Voltage Scaling (AVS) bus and NVIDIA's Pulse Width Modulation Voltage Identification (PWM-VID) bus. A common feature of these buses are high speed serial clock rates to support static and dynamic control of the operating voltage, optimized voltage transitions, multiple power states or modes of operations, support for multiple rails, command handshaking to ensure robust operation, and a wide range of telemetry, status, and alert signals and registers to monitor and optimize the power system operation subject to thermal, power dissipation, input power, or other restraints.

When connected the auto-test platform 115 to the computer 100, the GUI will be generated by the virtual bench 121 running on the computer 100 and may provide communications supported by the voltage regulator 114, and then the auto-test setting can be provided. The auto-test setting can be transmitted by the virtual bench 121 to the test master 113 when the test is triggered by the testing user. The test master 113 receives the auto-test setting by way of the I/O bus interface 112, produces a test suite that comprises a plurality of serial command frames by executing the loop multiple times in accordance with the auto-sweep setting, sequentially transmits every serial command frame over a serial communication bus 176 to the voltage regulator and receives every resulting behavior of the voltage regulator when operated in accordance with the every serial command frame. Once the auto-test setting is configured, the test suite is determined. In one embodiment, a test suite is produced by executing the loop multiple times according to the auto-sweep setting until an array of a preset variable corresponding to the auto-sweep setting is traversed, wherein for each iteration of the loop, the preset variable is changed.

In one embodiment, the test master 113 further provides the resulting behaviors of the voltage regulator 114 to the computer 100. In one embodiment, the resulting behaviors of the voltage regulator 114 comprise one or more of: a listing for error reporting and fault logging, unexpected results and one or more serial command frames related to the unexpected results. In one embodiment, once the test suite has been executed, execution statues will be summarized and displayed in the computer 100, rather than comparing the resulting waveform with a voltmeter in prior art.

Figure 2:
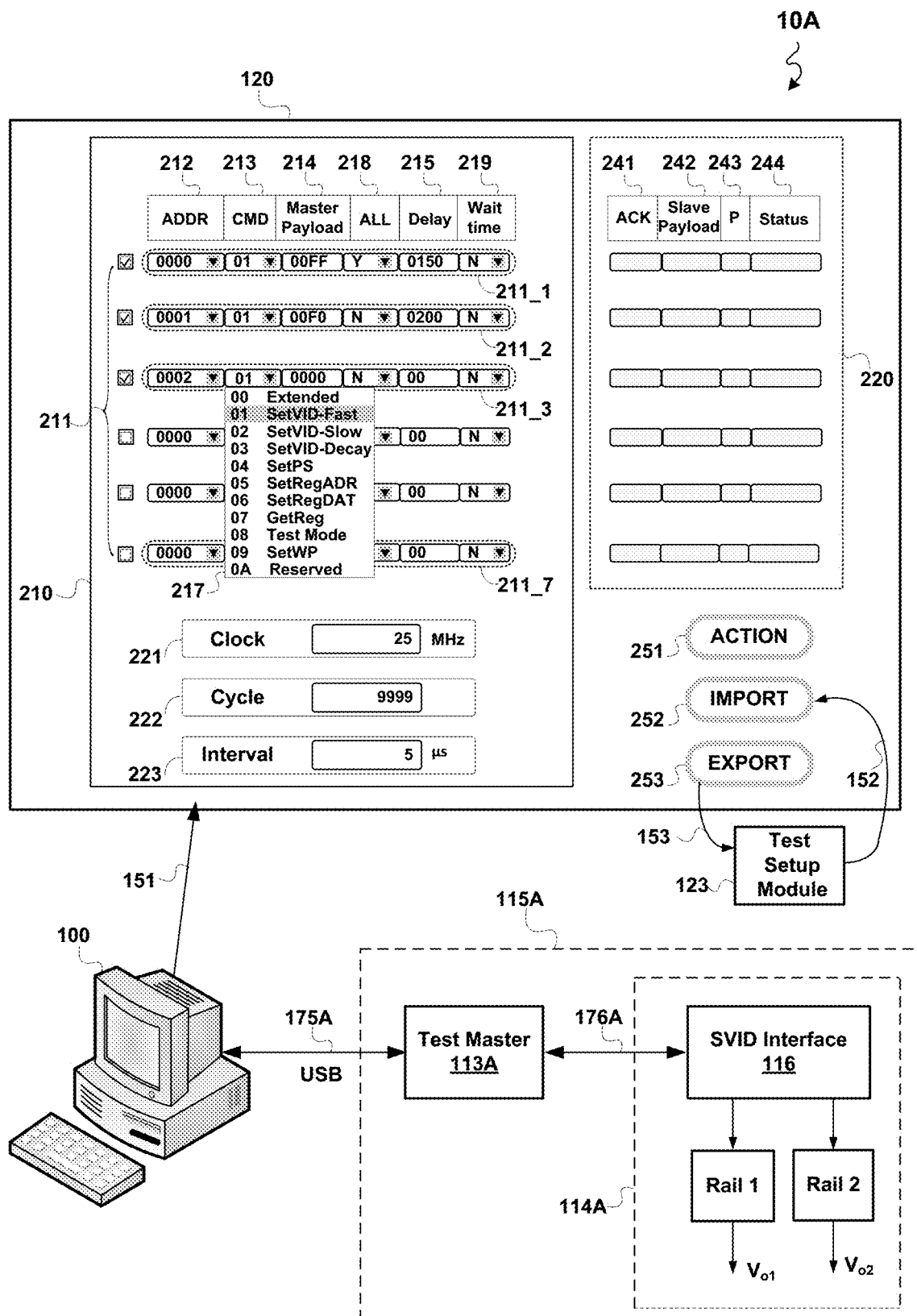
FIG. 2 schematically illustrates operation of a system 10A for automatically testing a voltage regulator in accordance with an embodiment of the present invention.

FIG. 2 schematically illustrates operation of a system 10A for automatically testing a voltage regulator 114A in accordance with an embodiment of the present invention. In the example of FIG. 2, a configured voltage regulator 114A and a test master 113A are installed in an auto-test platform 115A. As can be appreciated, in other embodiments, the voltage regulator 114A may also be configured while installed in the auto-test platform 115A instead of in a configuring board, wherein the configuration to the voltage regulator 114A comprises pin configuration for application configuration parameters and/or internal circuits configuration pre-programmed at the factory.

As shown in FIG. 2, the auto-test platform 115A comprises a serial communication bus 176A that supports a SVID bus. The voltage regulator 114A comprises a SVID interface 116 configured to communicate over serial communication bus 176A. The voltage regulator 114A provides multiple supply voltages to a processor.

In the example of FIG. 2, the voltage regulator 114A provides a first output voltage VO1 for rail1 and a second output voltage VO2 for rail2. The voltage regulator 114A can be configured as 1~n phase for rail and 1~m phase for rail 2, wherein both n and m are integers. Wherein rail1 and rail2 are located at the different register addresses.

In the example of FIG. 2, a GUI 120 may be generated by the virtual bench 121 running on the computer 100 (see arrow 151) and is used to provide an auto-test setting. The GUI 120 may be configured to enable a testing user to create and modify auto-test setting for the various conditions. The GUI 120 in FIG. 2 can support SVID communication. As another example, a GUI generated by the virtual bench 121 can support SVI2 or AVSBUS communication. The auto-test setting specifies an auto-sweep setting and a loop that comprises an ordered set of serial command frames.

The test master 113B is configured to convert signals of the I/O bus 175A to serial communication bus (176A) compatible signals which are received by the voltage regulator 114A. The test master 113B receives the auto-test setting over an external I/O bus 175A coupled to the computer 100, produces a test suite that comprises a plurality of serial command frames by executing the loop multiple times in accordance with the auto-sweep setting, sequentially transmits every serial command frame over a serial communication bus 176A to the voltage regulator 114A and receives every resulting behavior of the voltage regulator 114A when operated in accordance with the every serial command frame.

As an example, a method for providing the auto-test setting by way of the GUI 120 comprises: clicking on a icon 252 (IMPORT) displayed in the GUI 120, and invoking the auto-test setting that already designed configuration files stored in a test setup module 123 (see arrow 152). The test setup module 123 may include a plurality of configuration files and provide a list to being selected to meet different test requirements.

As another example, a method for providing the auto-test setting by way of the GUI 120 comprises step A~C. At step A, selecting an ordered set of serial setting frames from a listing of serial setting frames, wherein the selected set of serial setting frames is corresponding to the loop. At step B, specifying the parameter values for each selected serial setting frame. For example, specifying an address, a command and a master payload for each selected serial setting frame. At step C, adding the auto-sweep setting to a selected serial setting frame.

In this document, relational terms such as step A and step B, and the like may be used solely to distinguish one entity or action from another entity or action without necessarily requiring or implying any actual such relationship or order between such entities or actions. "A," "B," "C," etc. simply denote different singles of a plurality and do not imply any order or sequence unless specifically defined by the claim language. The sequence of the text in any of the embodiments does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

The GUI 120 provides a series of interface techniques that makes it easy to provide the auto-test setting. As shown in FIG. 2, the GUI 120 displays a listing 211 including serial setting frames 211_1~211_7 in a window 210. The listing 211 is available for multiple test cases execution in various conditions. The step A comprises selecting an ordered set of serial setting frames from the listing 211 by checking the check boxes on the left of the listing 211. The serial setting frames 211_1~211_3 are orderly checked and selected for example. The selected serial setting frames 211_1~211_3 is corresponding to an ordered set of serial command frames 201~203. The serial command frames 201~203 are in order and form the loop.

In the example of FIG. 2, each serial setting frame has parameter fields including an ADDR filed 212, a CMD field 213 and a master payload field 214. The ADDR field 212 has three different address options including a slave address 0000 only for rail1, a slave address 0001 only for rail 2 and a slave address 0002 for both rail1 and rail2. Theses address options can be pre-programmed at the factory or configured with pin configuration. The CMD filed 213 has a selectable dropdown menu 217 including a series of command types. The command type can be renamed. A new command type can be added to the dropdown menu 217, and one or more command types can be deleted from the dropdown menu 217. The master payload field 214 may include a data for a target output voltage or a resistor address.

In one embodiment, the step C comprises: adding one or more auto-sweep settings to the selected serial setting frames 211_1~211_3 such that one or more test suites having one or more auto-sweep functions can be automatically generated. The auto-sweep settings may include one or more of a wait time auto-sweep setting 219, a master payload auto-sweep setting 218 and a command type auto-sweep setting 216. Wherein the wait time means the time before transmitting the next serial command frame of the loop. The master payload auto-sweep setting 218 may be added to the selected serial setting frame 211_1 by selecting the option "Y" in the example of FIG. 2. The command filed 213 further comprises an option 0B to enable the command type auto-sweep setting 216 for automated execution of all the command types listed in the dropdown menu 217.

In one embodiment, the method for providing the auto-test setting further comprises specifying the clock frequency 221 for communicating between the test master 113A and the voltage regulator 114A being tested, the iteration times 222 for executing the loop and the time interval 233 before executing a subsequent iteration of the loop.

In a further embodiment, the auto-test setting can be stored in a configuration file in table format. As an example, the configuration file may set in XLSX format. This configuration file summarizes the parameter values, variables, auto-test settings and the sequence and data for the iteration execution of the loop. In one embodiment, the configuration file can be stored in the test setup module 123 by clicking the icon 253 (EXPORT) in the GUI 120 (see arrow 153).

Once the auto-test setting is properly configured, the test may be performed by clicking the icon 251 (ACTION). In the example of FIG. 2, the auto-test setting may be transmitted to the test master 113A from the computer 100 by way of the serial communication bus 175A. The test master 113A provides an automated execution of the test suite according to the various conditions defined in the auto-test setting. For example, the test master 113A may read the configuration file in XLS format and perform activities based on the sequence and data provided in the XLS configuration file instead of using detailed scripting instructions.

The voltage regulator 114A receives a serial command frame and modifies the internal configuration parameters of the voltage regulator 114A to regulate the output voltage, and returns a serial response frame to the test master 113B according to the operation. The internal configuration parameters are used to select the components and adjust the parameters for the voltage regulator operation. The term "serial response frame" as used in this specification and claims means a resulting behavior of the voltage regulator 114A when operated in accordance with the serial command frame transmitted by the test master 113A. In one embodiment, the serial response frame comprises ACK bits that indicating confirm or reject of the serial command frame. In another embodiment, the serial response frame comprises ACK bits and salve payload bits.

The test master 113A provides the resulting behaviors of the voltage regulator 114A to the record module 122 in the computer 100. The resulting behaviors can be displayed in the window 220 of the GUI 120 and comprises one or more of a polarity error 243, the text field 241 for the ASK bits and the text field 242 for the slave payload bits of the serial response frame, the status field 244 indicating the status of the voltage regulator 114A. Errors and unexpected results that occur during the test execution may be logged or captured for further analysis. This is more convenient than using a voltmeter to check the results in the prior art, and thus high efficient and avoid the manual mistakes.

Figure 3:
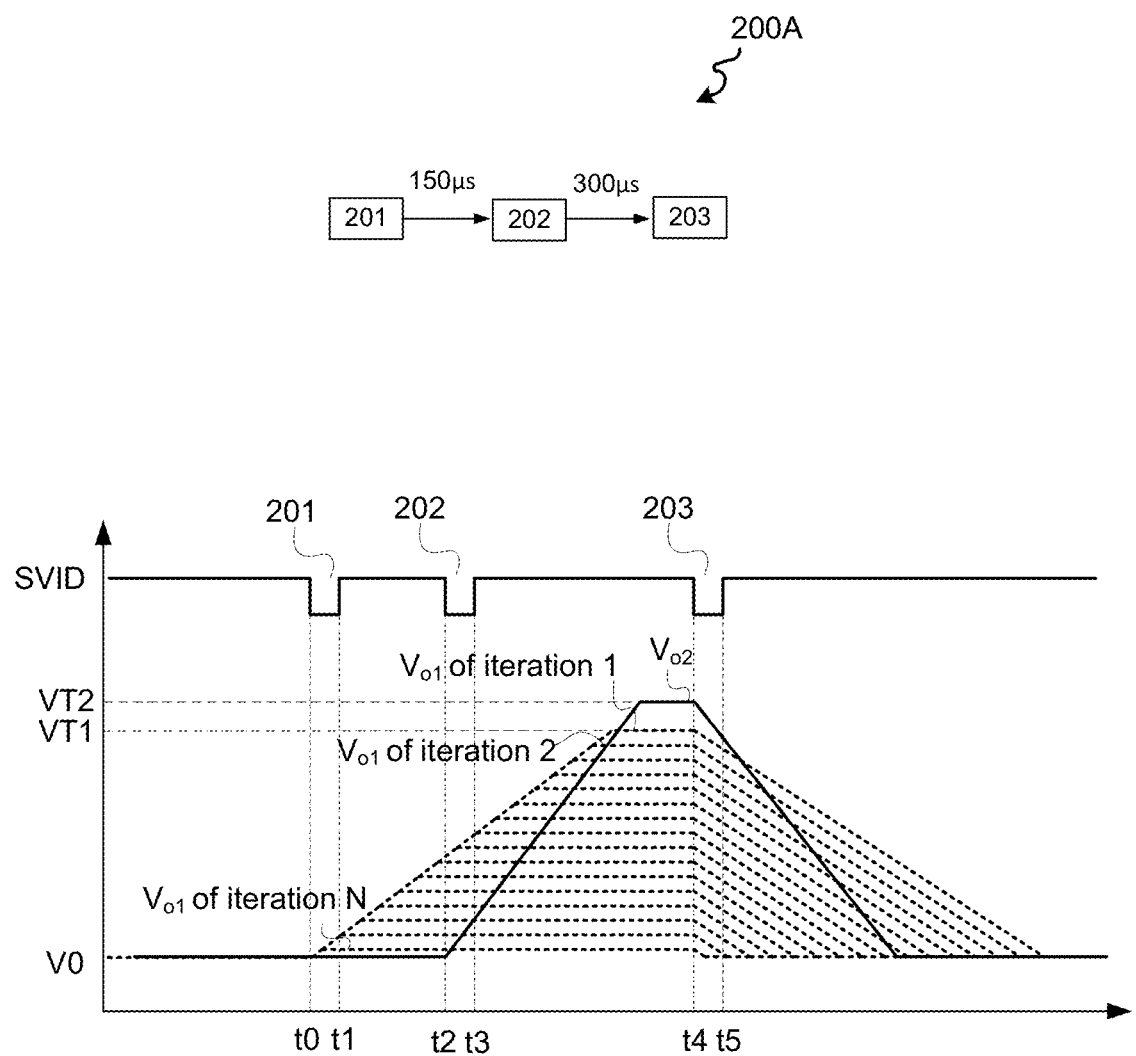
FIG. 3 schematically illustrates a loop 200A and signal waveforms of execution of the loop 200A in accordance with an embodiment of the present invention.

FIG. 3 schematically illustrates a loop 200A and signal waveforms of execution of the loop 200A in accordance with an embodiment of the present invention. The loop 200A comprises serial command frames 201~203. Wherein a SVID signal represents an envelope of time and is normally high and is pulled low when a serial command frame is being transmitted. In the example of FIG. 3, a first target voltage is a master payload of the serial command frame 201 and is configured to rail1 of the voltage regulator 114A, a second target voltage is a master payload of the serial command frame 202 and is configured to rail2 of the voltage regulator 1114A, a third target voltage is a master payload of the serial command frame 203 and is configured to both rail1 and rail2, and a master payload auto-sweep setting is added in the serial command frames 201.

As shown in FIG. 3, the serial bus 176A is orderly transmitting the serial command frames 201~203 to the voltage regulator 114A, to regulate the first output voltage VO1 for rail1 and the second output voltage VO2 for rail2. At an initial time t0, the SVID signal is pulled low indicating the start of the transmitting of the serial command frame 201. Upon completion of the transmitting of the serial command frame 201 at time t1, the SVID signal is pulled high. At a subsequent time t2, the SVID signal is pulled low indicating the start of the transmitting of the serial command frame 202. Upon completion of the transmitting of the serial command frame 202 at time t3, the SVID signal is pulled high. At a subsequent time t4, the SVID signal is pulled low indicating the start of the transmitting of the serial command frame 203. Upon completion of the transmitting of the serial command frame 203 at time t5, the SVID signal is pulled high.

The loop 200A is executed N times, the first target voltage is traversed from a first initial target voltage VT1 to a minimum adjustable voltage. For each iteration of the loop 200A, the first target voltage is reduced by a preset voltage. For iteration 1 of the loop 200A, the first target voltage equals with the first initial target voltage VT1. For iteration 2 of the loop 200A, the first target voltage is reduced to the difference between the first initial target voltage VT1 and the preset voltage. For iteration N of the loop 200A, the first target voltage is reduced to be the minimum adjustable voltage. In addition, for each iteration of the loop 200A, the second output voltage VO2 increases from an initial voltage V0 and ramps up to a second initial target voltage VT2, then from time t5 the first output voltage VO1 and the second output voltage VO2 ramps down to the initial voltage V0.

As seen in FIG. 3, the test master 113B provides the automated generation a test suite having the master payload auto-sweep function instead of a processer (e.g. the CPU). Compared with the prior art, the present invention provides an easy way to improve the test efficiency because of the auto-sweep settings.

Figure 4:
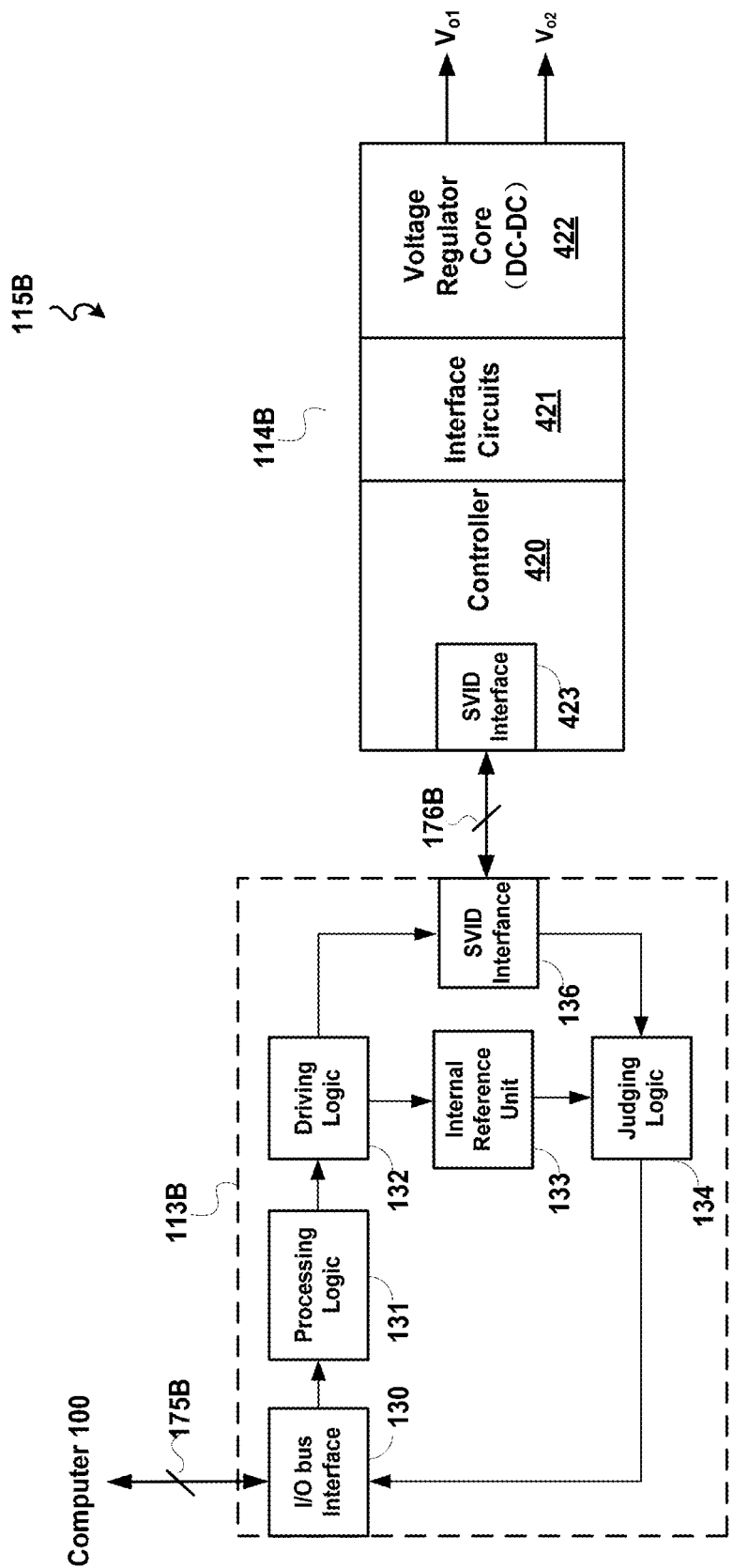
FIG. 4 illustrates a schematic diagram of an auto-test platform 115B for automatically testing a voltage regulator 114B in accordance with an embodiment of the present invention.

FIG. 4 illustrates a schematic diagram of an auto-test platform 115B for automatically testing a voltage regulator 114B in accordance with an embodiment of the present invention. In the example of FIG. 4, the test master 113B comprises an I/O bus interface 130, a processing logic 131, a driving logic 132, an internal reference unit 133, a judging logic 134 and a SVID bus interface 136.

The SVID bus interface communicates over the serial communication bus 176B, the I/O bus interface 130 communicates over the I/O bus 175B. The test master 113B receives the configuration file of the auto-test setting from the computer 100 by communicating with the I/O bus 175B. The processing logic 131 reads the configuration file and provides the automated generation of one or more test suites. In one embodiment, the test suite is produced by executing the loop multiple times until an array of a preset variable corresponding to the auto-sweep setting is traversed, wherein for each iteration of the loop, the preset variable is changed.

The driving logic 132 sequentially transmits every serial command frame over the serial communication bus 176B to the voltage regulator 114B, in accordance with the sequence and data specified by the auto-test setting. In addition, the driving logic 132 also orderly transmits every serial command frame to the internal reference unit 133. The internal reference unit 134 consults with a knowledge base to automatically retrieve or determine an expected reference for each serial command frame.

The voltage regulator 114 may be packaged as an IC. In the example of FIG. 4, the voltage regulator 114B comprises a controller 420, a plurality of interface circuits 421, and a voltage regulator core comprising a DC-DC converter 422. The controller 420 comprises a SVID bus interface 423. In another embodiment, the SVID bus interface 423 and the controller 420 are the separate and discrete devices. The SVID interface 423 communicates with the test master 113B over the serial communication bus 176B. In one embodiment, the controller 420 is a multi-phase controller to control the multi-phase DC/DC converter 422.

The controller 420 may comprise electrical circuitry that receives every serial command frame from an electrical device processor (as a load) or the test master 181 and outputs digital calibration bits in accordance with the internal configuration parameters adjusted by the serial command frame. The digital calibration bits may be applied to the DC-DC converter 422 by way of the interface circuits 421. The interface circuits 421 may comprise one or more electrical circuits that provide hooks for calibrating the voltage regulator 114 in accordance with digital calibration bits received from the controller 420. The controller 420 may also communicate over the serial bus 176B to orderly send serial response frames to the test master 113B by way of the SVID bus interface 423, based on the operation of the voltage regulator 114B.

In the example of FIG. 4, the judging logic 134 receives the expected reference from the internal reference unit 133 and the serial response frames from the SVID bus interface 136, and judges if the resulting behavior of the voltage regulator 114B matches with the expected results by comparing every serial response frame with the expected reference, and automatically records and transmits the unexpected results to the record module 122 in the computer 100. The process of transmitting a serial command frame to the voltage regulator 114B by the test master 113B, determining the corresponding internal configuration parameters based on the received serial command frame, returning the corresponding serial response frame according to the operation of the voltage regulator 114 with the internal configuration parameters and judging if the results meets the expected results is repeated until completion of the execution of all the serial command frames.

Upon completion of the test suite execution, the resulting behaviors of the voltage regulator 114B as a whole may be provided to the testing user by way of the I/O bus 175B. This may include presenting a detailed or summarized log of test case execution activities; a listing of pass/fail test case results; or alerts provided to the testing user. As an example, one or more serial command frames related to an unexpected resulting behavior are displayed in the computer. This helps to further analyze causes of encountered problems.

Figure 5:
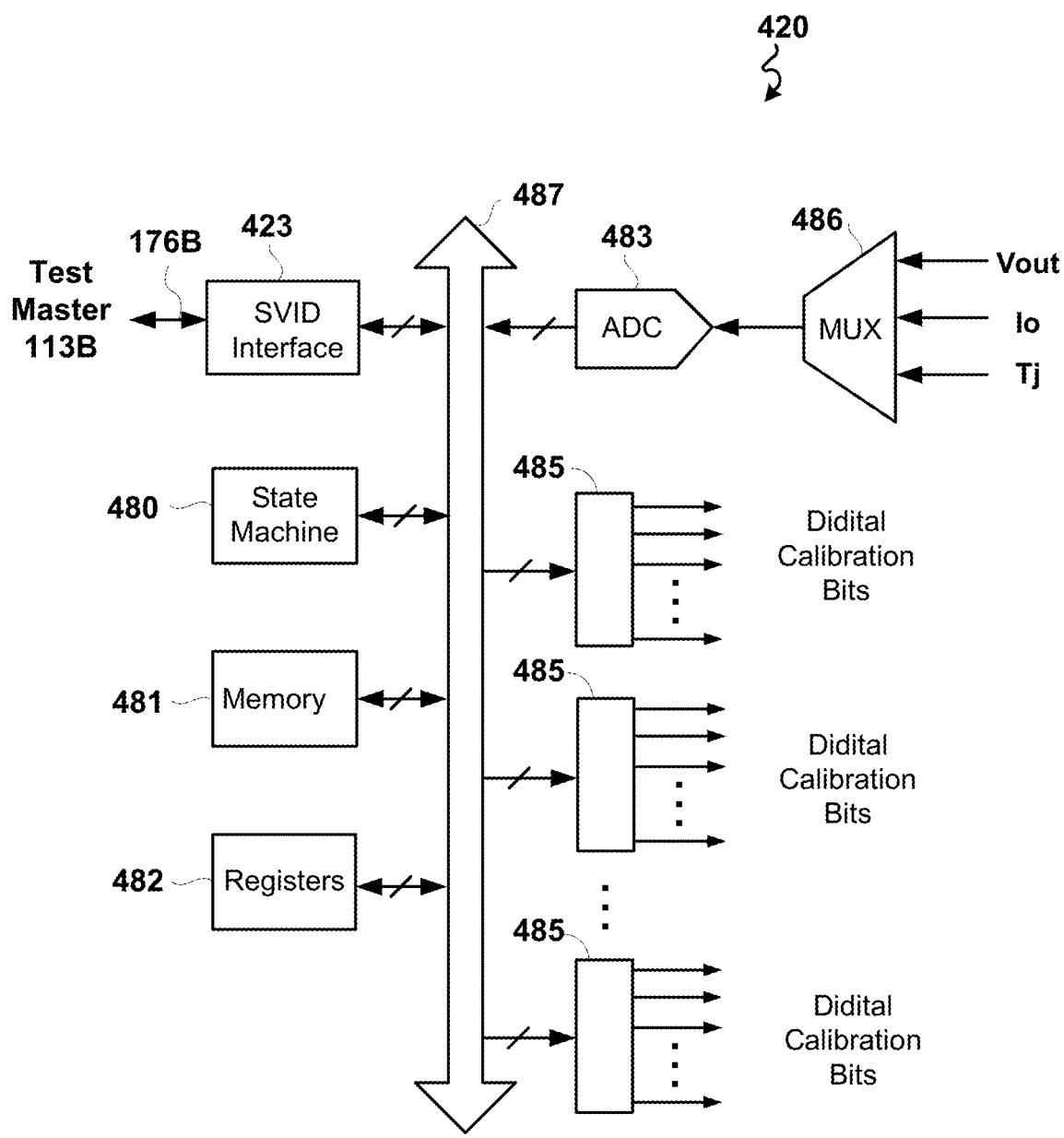
FIG. 5 illustrates a schematic diagram of a controller 420 in accordance with an embodiment of the present invention.

FIG. 5 illustrates a schematic diagram of a controller 420 in accordance with an embodiment of the present invention. In the example of FIG. 5, the controller 420 includes an I/O bus interface 423 that performs serial to parallel conversion. The components of the controller 420 may communicate over an internal bus 487.

The controller 420 includes a control circuit in the form of a state machine 480. The state machine 480 may use the memory storage space provided by the nonvolatile memory (NVM) 481 and banks of registers 482 as temporary workspace and general storage. In one embodiment, the NVM 481 is configured to store or change internal configuration parameters of the voltage regulator 114B. The state machine 480 may be configured to receive serial command frame over the SVID bus interface 423, and sequence through a series of predetermined states to output corresponding digital calibration bits in accordance with the internal calibration settings pre-stored in the registers 482 or the NVM 481. In one embodiment, the state machine 480 sends out the corresponding digital calibration bits over the internal bus 487 to one or more digital output ports 485. A digital output port 485 may be coupled to one or more components of interface circuits 421.

In one embodiment, the controller 420 receives a serial command frame having a SVID-Fast command from the test master 113B. The state machine 480 may change a reference voltage value by effecting serial command frame and such that can regulate the output voltage of the DC/DC converter to the target voltage specified by the master payload in serial command frame.

The controller 420 may receive a serial command frame having a GetReg command from the test master 113B, for example, to report internal conditions, such as output voltage (Vout), junction temperature (Tj), output current (Io), etc. In response to the serial command frame with GetReg command, the state machine 480 may cycle through predetermined states to select the particular sensed condition from the input of a multiplexer 486, to retrieve the digital value of the sensed condition from an ADC 483, and to transfer a serial response frame having the digital value of the sensed condition as the slave payload to the test master 113B by way of the SVID bus interface 423.

FIGS. 6~10 schematically illustrate a test suite or test suites having one or more auto-sweep functions in accordance with an embodiment of the present invention. In the following description, how a test suite is produced is introduced. Several of the details of the embodiments described below with reference to FIGS. 6~10.

Figure 6:
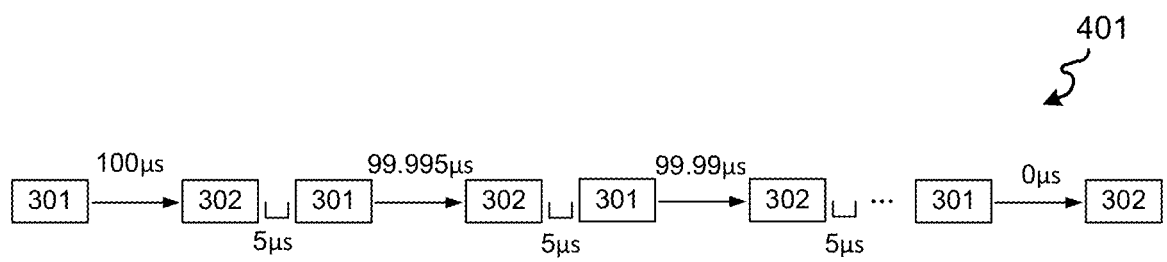
FIGS. 6~10 schematically illustrate a test suite or test suites having one or more auto-sweep functions in accordance with an embodiment of the present invention.

In the example of FIG. 6, a loop 300 comprises a serial command frame 301 and serial command frame 302 which are arranged in order. The wait time auto-sweep setting is added in a serial setting frame 301_1 corresponding to the serial command frame 301, the wait time auto-sweep function is enabled, a test suite 401 having the wait time auto-sweep function is produced by executing the loop 300 multiple times until the wait time before transmitting the serial command frame 302 is traversed from a maximum value to a minimum value. Wherein for each iteration of the loop 300, the wait time before transmitting the serial command frame 302 is reduced by a preset value. In one embodiment, the wait time is traversed from 100 μs to 0 μs, for each iteration of the loop 300, the wait time is reduced by 5 ns. In another embodiment, the maximum value of the wait time before transmitting a next serial command frame is a settling time of the voltage regulator when operated in accordance with the current sent serial command frame. The minimum value is the length of the current sent serial command frame. In the example of FIG. 6, an interval time between two iterations of the loop is 5 μs, which can be determined by the interval 223 of the GUI 120.

Figure 7:
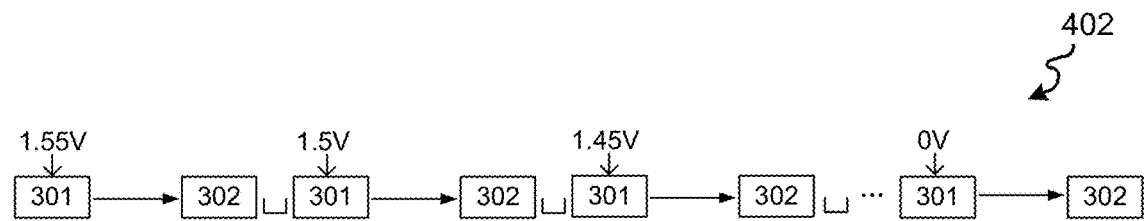

In the example of FIG. 7, the master payload auto-sweep setting is added to the serial setting frame 301_1 corresponding to the serial command frame 301, the master payload auto-sweep function is enabled, a test suite 402 having the master payload auto-sweep function is produced by executing the loop 300 multiple times until a target voltage as the master payload of the serial command frame 301 is traversed from an initial target voltage to a minimum adjustable voltage, wherein for each iteration of the loop 300, the target voltage as the master payload of the serial command frame 301 is adjusted by a preset voltage. In one embodiment, the target voltage as the master payload of the serial command frame 301 is adjusted from 1.55V to 0V, and the preset voltage is 1LSB (Least Significant Bit). In another embodiment, the target voltage can be traversed from FFH to 00H.

In still another embodiment, the test suite having the master payload auto-sweep function is produced by executing the loop 300 multiple times until every resistor address in a resistor address array is traversed, wherein for in each iteration of the loop, the resistor address as a master payload of a serial command frame of the loop is changed to a new resistor address.

Figure 8:
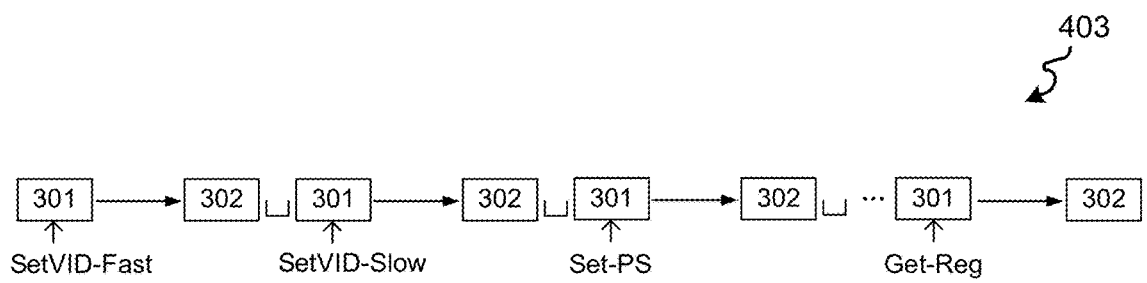

In the example of FIG. 8, the command type auto-sweep setting is added to the command of the serial setting frame 301_1, the command type auto-sweep function is enabled, a test suite 403 having the command type auto-sweep function is produced by executing the loop 300 multiple times until every command type in a command type array (e.g. the dropdown menu 217) is traversed, wherein for each iteration of the loop 300, the command type of the serial command frame 301 is changed to be a new command type.

Figure 9:
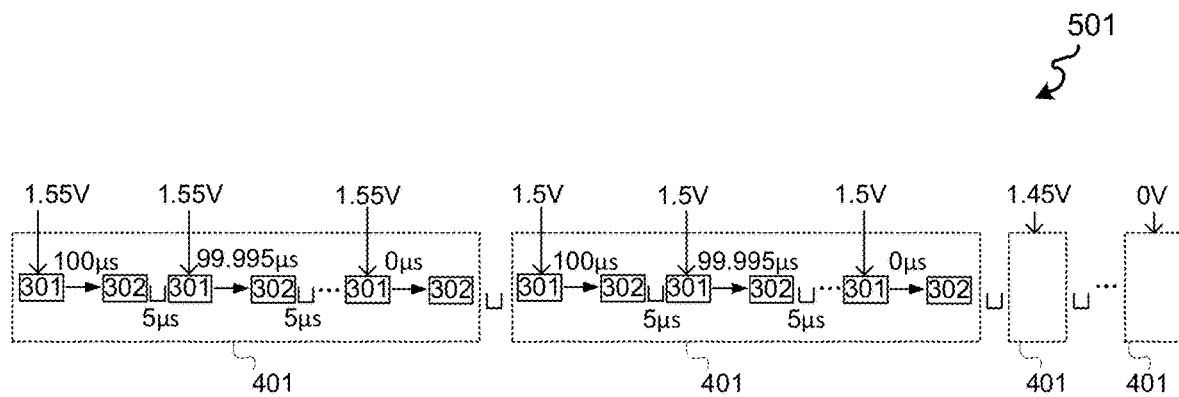

In the example of FIG. 9, the wait time auto-sweep setting and the master payload auto-sweep setting are both added to the serial setting frame 301_1, a test suite 501 having the wait time auto-sweep and master payload functions is produced by executing the test suite 401 multiple times until the target voltage as the master payload of the serial command frame 301 is traversed from the initial target voltage (e.g. 1.55V) to the minimum adjustable voltage (e.g. 0V), wherein for each iteration of the test suite 401, the target voltage as the master payload of the serial command frame 301 is adjusted by a preset voltage (e.g. 0.5V). In another example, a test suite 501 having the wait time auto-sweep and master payload functions is produced by executing the test suite 402 multiple times until the wait time before transmitting the serial command frame 302 is traversed from the maximum value to the minimum value. Wherein for each iteration of the loop 402, the wait time before transmitting the serial command frame 302 is reduced by the preset value.

Figure 10:
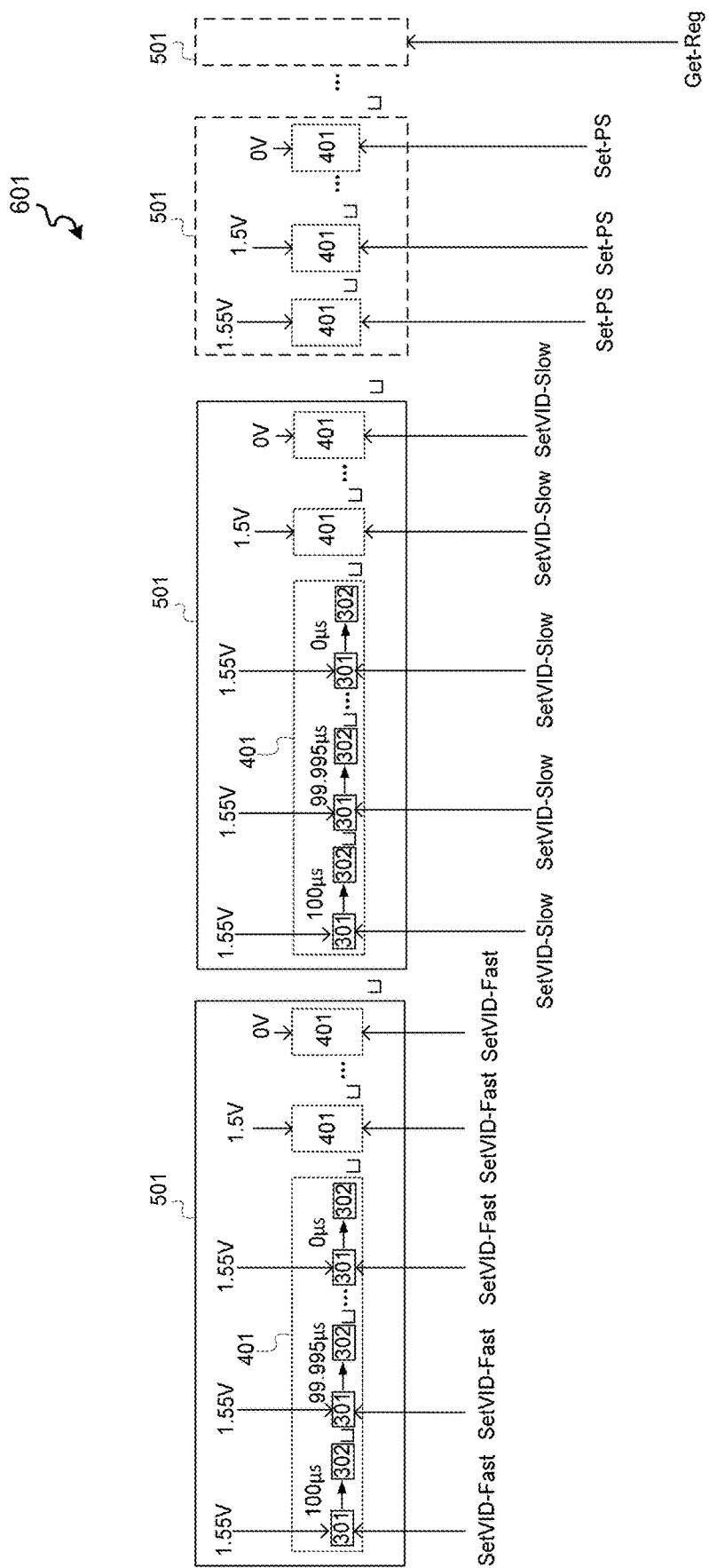

In the example of FIG. 10, Three auto-sweep settings including the wait time auto-sweep setting, the master payload auto sweep setting and the command auto-sweep setting, are added to the serial command frame 301, a test suite 601 having the three auto-sweep functions is produced by executing the test suite 501 multiple times until every command type in a command type array (e.g. the dropdown menu 217) is traversed, wherein for each iteration of the test suite 501, the command type of the serial command frame 301 is changed to be a new command type.

Compared with the prior art, the embodiments in accordance with the present invention provides an easy way to cover all possible test conditions for a voltage regulator by traversing all the command types, wait time and the data of the master payload, and thus improve the test efficiency and save the time cost.

Figure 11:
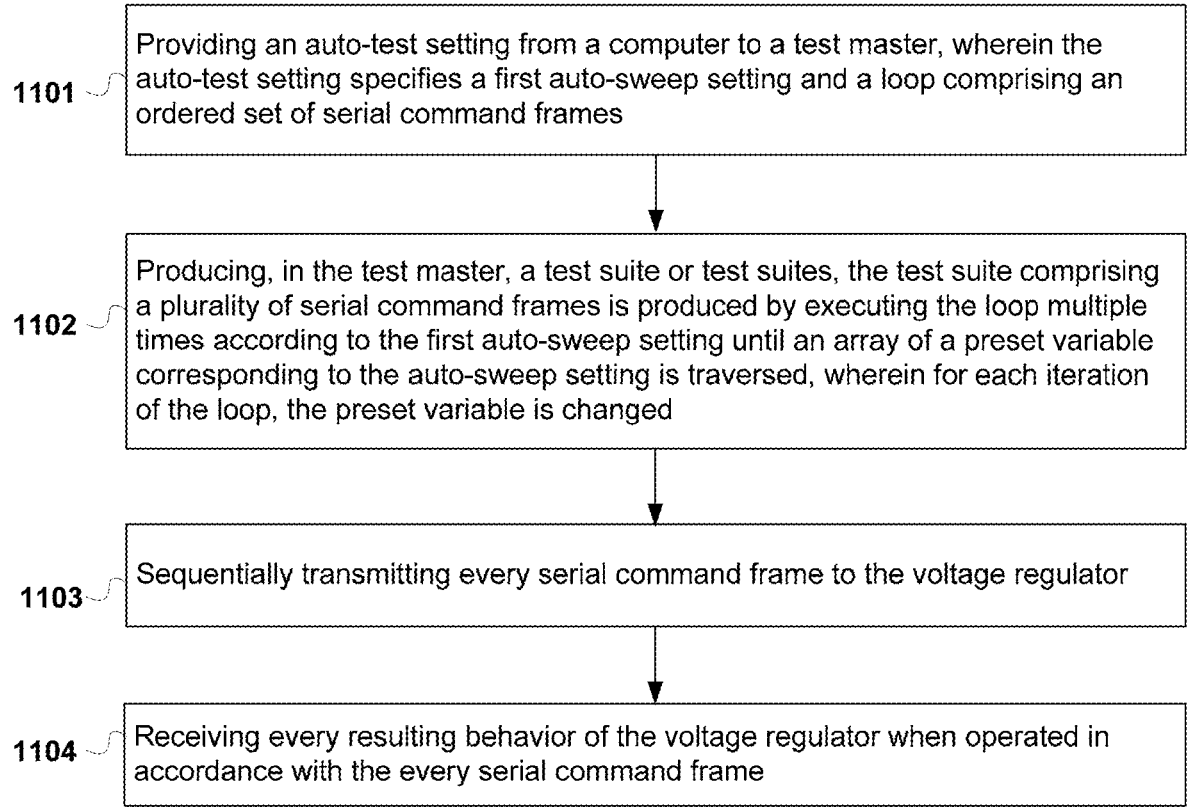
FIG. 11 illustrates a flow diagram of a method of automatically testing a voltage regulator in accordance with an embodiment of the present invention.

FIG. 11 illustrates a flow diagram of a method of automatically testing a voltage regulator in accordance with an embodiment of the present invention. The method comprises steps S1101~S1104.

At step S1101, an auto-test setting for testing the voltage regulator is provided from a computer to a test master. Wherein the auto-test setting specifies a first auto-sweep setting and a loop comprising an ordered set of serial command frames.

At step S1102, in the test master, a test suite comprising a plurality of serial command frames is produced by executing the loop multiple times according to the first auto-sweep setting until an array of a preset variable corresponding to the first auto-sweep setting is traversed, wherein for each iteration of the loop, the preset variable is changed.

At step S1103, every serial command frame is sequentially transmitted to the voltage regulator.

At step S1104, the test master receives every resulting behavior of the voltage regulator when operated in accordance with the every serial command frame.

In one embodiment, the first auto-sweep setting comprises a wait time auto-sweep setting, the test suite is produced by executing the loop multiple times until a wait time before transmitting a next serial command frame of the loop is reduced from a maximum value to a minimum value, wherein for each iteration of the loop, the wait time is reduced by a preset value.

In another embodiment, the first auto-sweep setting comprises a master payload auto-sweep setting, the test suite is produced by executing the loop multiple times until a target voltage as a master payload of a serial command frame of the loop is adjusted from an initial target voltage to a minimum adjustable voltage, wherein for each iteration of the loop, the target voltage is adjusted by a preset voltage.

In still another embodiment, the first auto-sweep setting comprises a master payload auto-sweep setting, the test suite is produced by executing the loop multiple times until every resistor address in a resistor address array is traversed, wherein for in each iteration of the loop, the resistor address as a master payload of a serial command frame of the loop is changed.

In yet embodiment, the first auto-sweep setting comprises a command type auto-sweep setting, the test suite is produced by executing the loop multiple times until every command type in a command type array is traversed, wherein for each iteration of the loop, the command type of a serial command frame of the loop is changed.

In one embodiment, the auto-test setting further specifies a second auto-sweep setting, test suites are produced by executing the test suite multiple times in accordance with a second auto-sweep setting until an array of a second preset variable corresponding to the second auto-sweep setting is traversed, wherein for each iteration of the test suite, the second preset variable is changed.

In one embodiment, the method further comprises providing the resulting behaviors of the voltage regulator to the computer.

Figure 12:
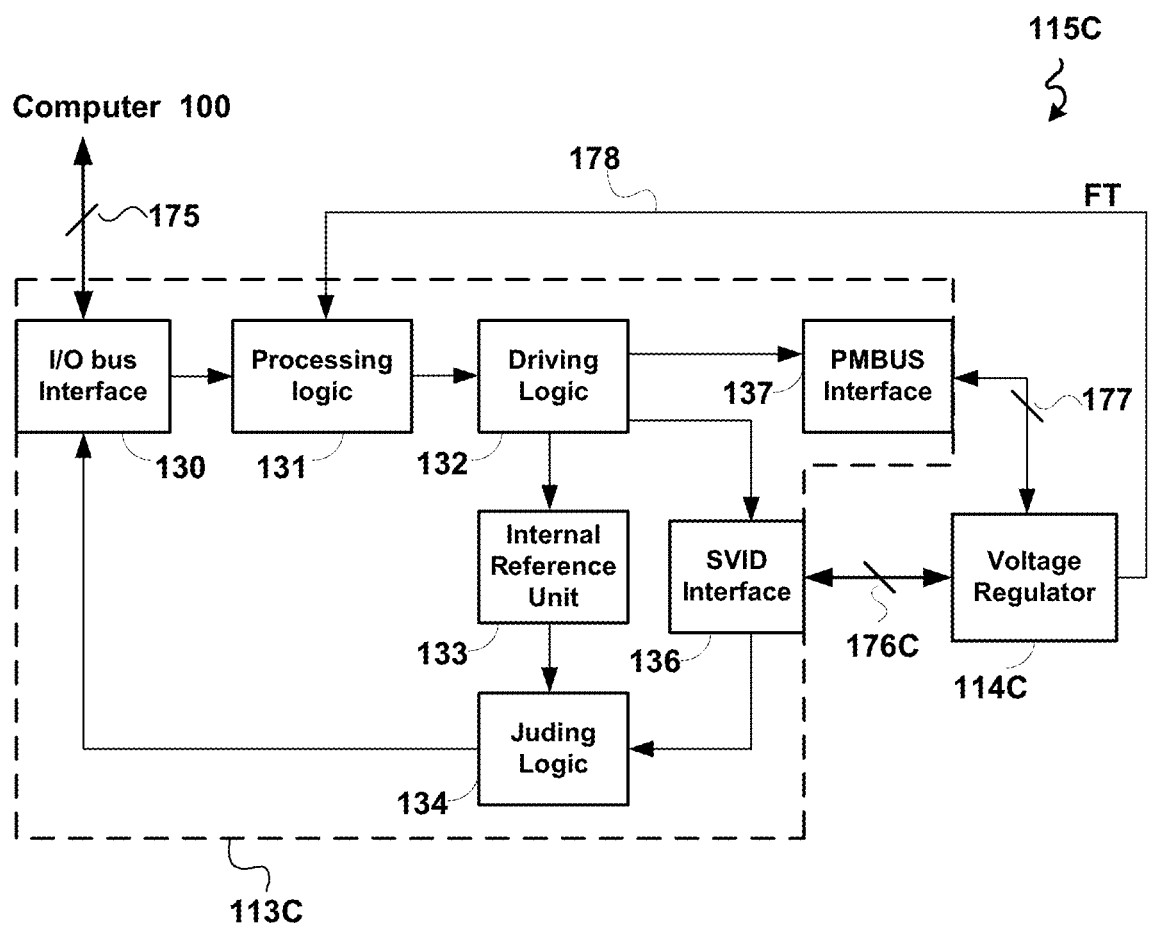
FIG. 12 illustrates a block diagram of an auto-test platform 115C for automatically testing voltage regulator in accordance with another embodiment of the present invention.

FIG. 12 illustrates a block diagram of an auto-test platform 115C for automatically testing voltage regulator in accordance with another embodiment of the present invention.

In the example of FIG. 12, a configured voltage regulator 114C and a test master 113C are installed in the auto-test platform 115C. As shown in FIG. 12, the auto-test platform 115C comprises a SVID bus 176C and a PMBUS bus 177. The test master 113C comprises an I/O bus interface 130, a processing logic 131, a driving logic 132, an internal reference unit 133, a judging logic 134, a SVID interface 136 and a PMBUS interface 137. The SVID interface 136 communicates over the SVID bus 176C, the PMBUS interface 137 communicates over the PMBUS bus 177.

The voltage regulator 114C may indicate an alert over a fault alert line 178 coupled to the test master 113C, during the test execution. If there is a fault in the voltage regulator 114C, a signal FT on the fault alert line 178 is pulled low, to notify the fault condition. When the signal FT with the logic low is sensed by the test master 113C, the test master 113C automatically sends a serial command frame with read instruction over the PMBUS bus 177 to the voltage regulator 114C, the voltage regulator 114C returns a resulting value that is stored in a particular internal status register of the voltage regulator 114C to ascertain the fault type, for example, an overvoltage fault, an overcurrent fault, and so on. As another example, the test master 113C sends the resulting value to the record module 123 in the computer 100 for further analysis.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A method of automatically testing a voltage regulator, the method comprising:
providing an auto-test setting to a test master, wherein the auto-test setting specifies a first auto-sweep setting and a loop that comprises an ordered set of serial command frames, to meet a test requirement of the voltage regulator;
producing, in the test master, a test suite or test suites, wherein the test suite that comprises a plurality of serial command frames is produced by executing the loop multiple times in accordance with the first auto-sweep setting until an array of a preset variable corresponding to the first auto-sweep setting is traversed, wherein for each iteration of the loop, the preset variable is changed;
sequentially transmitting every serial command frame to the voltage regulator; and receiving every resulting behavior of the voltage regulator when operated in accordance with the every serial command frame.

2. The method of claim 1, wherein the first auto-sweep setting comprises a wait time auto-sweep setting, and wherein producing the test suite comprises executing the loop multiple times until a wait time before transmitting a next serial command frame of the loop is traversed from a maximum value to a minimum value, wherein for each iteration of the loop, the wait time is adjusted by a preset value.

3. The method of claim 1, wherein the first auto-sweep setting comprises a master payload auto-sweep setting, and wherein producing the test suite comprises executing the loop multiple times until a target voltage as a master payload of a serial command frame of the loop is traversed from an initial target voltage to a minimum adjustable voltage, wherein for each iteration of the loop, the target voltage is adjusted by a preset voltage.

4. The method of claim 1, wherein the first auto-sweep setting comprises a master payload auto-sweep setting, and wherein producing the test suite comprises executing the loop multiple times until every resistor address in a resistor address array is traversed, wherein for in each iteration of the loop, the resistor address as a master payload of a serial command frame of the loop is changed.

5. The method of claim 1, wherein the first auto-sweep setting comprises a command type auto-sweep setting, and wherein producing the test suite comprises executing the loop multiple times until every command type in a command type array is traversed, wherein for each iteration of the loop, the command type of a serial command frame of the loop is changed.

6. The method of claim 1, wherein the auto-test setting further specifies a second auto-sweep setting, and wherein the test suites are produced by executing the test suite multiple times in accordance with a second auto-sweep setting until an array of a second preset variable corresponding to the second auto-sweep setting is traversed, wherein for each iteration of the test suite, the second preset variable is changed.

7. The method of claim 1, wherein the method further comprises providing one or more serial command frames related to an unexpected resulting behavior of the voltage regulator to the computer.

8. The method of claim 1, wherein providing the auto-test setting comprises generating a configuration file in a format that is readable for the test master.

9. The method of claim 1, wherein providing the auto-test setting comprises:
selecting an ordered set of serial setting frames from a listing of serial setting frames, wherein the selected set of serial setting frames is corresponding to the loop;
specifying an address, a command type and a master payload for each selected serial setting frame; and
adding the first auto-sweep setting to a selected serial setting frame.

10. The method of claim 1, wherein providing the auto-test setting comprises invoking an already designed configuration in the computer.

11. A system for automatically testing a voltage regulator, the system comprising:
a computer comprising a memory and a processor configured to execute computer-readable program code in the memory, the computer provides a graphical interface to a testing user for providing an auto-test setting, wherein the auto-test setting specifies a first auto-sweep setting and a loop comprising an ordered set of serial command frames, to meet a test requirement of the voltage regulator; and
a test master, receives the auto-test setting over an input/output (I/O) bus coupled to the computer, produces a test suite that comprises a plurality of serial command frames, sequentially transmits every serial command frame over a serial communication bus to the voltage regulator and receives every resulting behavior of the voltage regulator when operated in accordance with the every serial command frame, wherein the test suite is produced by executing the loop multiple times in accordance with the first auto-sweep setting until an array of a preset variable corresponding to the first auto-sweep setting is traversed, wherein for each iteration of the loop, the preset variable is changed.

12. The system of claim 11, wherein the first auto-sweep setting comprises a wait time auto-sweep setting, and wherein the test suite is produced by executing the loop multiple times until a wait time before transmitting a next serial command frame of the loop is traversed from a maximum value to a minimum value, wherein for each iteration of the loop, the wait time is adjusted by a preset value.

13. The system of claim 11, wherein the first auto-sweep setting comprises a master payload auto-sweep setting, and wherein the test suite is produced by executing the loop multiple times until a target voltage as a master payload of a serial command frame of the loop is traversed from an initial target voltage to a minimum adjustable voltage, wherein for each iteration of the loop, the target voltage is adjusted by a preset voltage.

14. The system of claim 11, wherein the first auto-sweep setting comprises a master payload auto-sweep setting, and wherein the test suite is produced by executing the loop multiple times until every resistor address in a resistor address array is traversed, wherein for in each iteration of the loop, the resistor address as a master payload of a serial command frame of the loop is changed.

15. The system of claim 11, wherein the first auto-sweep setting comprises a command type auto-sweep setting, and wherein the test suite is produced by executing the loop multiple times until every command type in a command type array is traversed, wherein for each iteration of the loop, the command type of a serial command frame of the loop is changed.

16. The system of claim 11, wherein the auto-test setting further specifies a second auto-test setting, and wherein the test suites are produced in the test master by executing the test suite multiple times in accordance with a second auto-sweep setting until an array of a second preset variable corresponding to the second auto-sweep setting is traversed, wherein for each iteration of the test suite, the second preset variable is changed.

17. The system of claim 11, wherein the test master further provides the resulting behaviors of the voltage regulator over the external I/O bus to the computer.

18. The system of claim 11, wherein the test master comprises:
an I/O bus interface, receives the auto-test setting over the external I/O bus coupled to the computer;
a processing logic, reads the auto-test setting by way of I/O bus interface and produces the test suite or test suites in accordance with the auto-test setting;
a driving logic, sequentially transmits every serial command frame over the serial communication bus to the voltage regulator; and a judging logic, receives every serial response frame of the voltage regulator when operated in accordance with the every serial command frame, compares every serial response frame and a corresponding expected reference to determine unexpected resulting behaviors, and provides one or more serial command frames related to the unexpected resulting behaviors over the I/O bus to the computer.

19. The system of claim 18 wherein the test master further comprises a PMBUS bus interface configured to communicate with the voltage regulator over a PMBUS bus and to ascertain a fault type of the voltage regulator when a fault alert of the voltage regulator is sensed over a fault line coupled between the voltage regulator and the test master.

20. The system of claim 11 wherein the serial communication bus comprises one of Intel's Serial Voltage Identification (SVID) bus, AMD's Serial Voltage Interface (SVI) bus, PMBUS Adaptive Voltage Scaling (AVS) bus and NVIDIA's Pulse Width Modulation Voltage Identification (PWMVID) bus.

* * * * *